(12) United States Patent
Bruel et al.

(10) Patent No.: US 8,475,693 B2
(45) Date of Patent: *Jul. 2, 2013

(54) METHODS OF MAKING SUBSTRATE STRUCTURES HAVING A WEAKENED INTERMEDIATE LAYER

(75) Inventors: Michel Bruel, Veurey Voroize (FR); Bernard Aspar, St. Ismier (FR); Chrystelle Lagahe-Blanchard, Crolles (FR)

(73) Assignee: Soitec, Bernin (FR)

( * ) Notice: Subject to any disclaimer, the term of this patent is extended or adjusted under 35 U.S.C. 154(b) by 107 days.

This patent is subject to a terminal disclaimer.

(21) Appl. No.: 13/162,230

(22) Filed: Jun. 16, 2011

(65) Prior Publication Data

US 2011/0250416 A1    Oct. 13, 2011

Related U.S. Application Data (63) Continuation-in-part of application No. 10/574,120, filed as application No. PCT/FR2004/002398 on Sep. 23, 2004, now Pat. No. 8,062,564, application No. 13/162,230, which is a continuation-in-part of application No. 12/087,093, filed as application No. PCT/FR2006/002886 on Dec. 27, 2006, now abandoned.

(30) Foreign Application Priority Data

Sep. 30, 2003   (FR) ...................................... 03 11450

(51) Int. Cl.
*B29C 44/34* (2006.01)
*B29C 65/00* (2006.01)
*H01L 21/30* (2006.01)
*B32B 37/00* (2006.01)
*H01L 21/46* (2006.01)

(52) U.S. Cl.
USPC ................ 264/51; 264/41; 264/42; 264/45.1; 264/46.4; 264/345; 264/346; 156/77; 156/78; 156/83; 156/90; 156/249; 438/455; 438/458

(58) Field of Classification Search
USPC   264/41, 42, 45.1, 46.4, 51, 345, 346; 156/77, 156/78, 83, 90, 249; 438/455, 458
See application file for complete search history.

(56) References Cited

U.S. PATENT DOCUMENTS

| | | | |
|---|---|---|---|
| 4,979,015 A | 12/1990 | Stierman et al. | 357/69 |
| 5,817,368 A | 10/1998 | Hashimoto | 427/255.38 |

(Continued)

FOREIGN PATENT DOCUMENTS

| | | |
|---|---|---|
| CN | 1586004 | 2/2005 |
| FR | 2 860 249 | 4/2005 |

(Continued)

*Primary Examiner* — Christina Johnson
*Assistant Examiner* — Atul P. Khare
(74) *Attorney, Agent, or Firm* — Winston & Strawn LLP (57) ABSTRACT

This invention provides composite semiconductor substrates and methods for fabricating such substrates. The composite structures include a semiconductor substrate, a semiconductor superstrate and an intermediate layer interposed between the substrate and the superstrate that comprises a material that undergoes a structural transformation when subject to a suitable heat treatment. The methods provide such a heat treatment so that the intermediate layer becomes spongy or porous, being filled with numerous micro-bubbles or micro-cavities containing a gaseous phase. The composite semiconductor substrates with structurally-transformed intermediate layers have numerous applications.

20 Claims, 5 Drawing Sheets

U.S. PATENT DOCUMENTS

| | | | |
|---|---|---|---|
| 5,854,123 A | 12/1998 | Sato et al. | 438/507 |
| 5,888,297 A | 3/1999 | Ogura | 117/94 |
| 6,020,252 A * | 2/2000 | Aspar et al. | 438/458 |
| 6,054,363 A * | 4/2000 | Sakaguchi et al. | 438/406 |
| 6,127,285 A | 10/2000 | Nag | 438/788 |
| 6,294,478 B1 * | 9/2001 | Sakaguchi et al. | 438/753 |
| 6,303,468 B1 | 10/2001 | Aspar et al. | 438/455 |
| 6,352,909 B1 | 3/2002 | Usenko | 438/458 |
| 6,417,075 B1 | 7/2002 | Haberger et al. | 438/459 |
| 6,426,270 B1 | 7/2002 | Sakaguchi et al. | 438/406 |
| 6,465,327 B1 | 10/2002 | Aspar et al. | 438/458 |
| 6,645,833 B2 * | 11/2003 | Brendel | 438/458 |
| 6,737,337 B1 | 5/2004 | Chan et al. | 438/455 |
| 6,756,286 B1 | 6/2004 | Moriceau et al. | 438/459 |
| 6,759,310 B2 | 7/2004 | Tayanaka | 438/458 |
| 6,774,010 B2 | 8/2004 | Chu et al. | 438/458 |
| 6,809,044 B1 | 10/2004 | Aspar et al. | 438/977 |
| 7,615,463 B2 | 11/2009 | Aspar et al. | 438/458 |
| 7,713,369 B2 | 5/2010 | Aspar et al. | 156/249 |
| 2002/0048844 A1 | 4/2002 | Sakaguchi | 438/106 |
| 2004/0014299 A1 | 1/2004 | Moriceau et al. | 438/459 |
| 2008/0038564 A1 | 2/2008 | Bruel | 428/446 |

FOREIGN PATENT DOCUMENTS

| | | |
|---|---|---|
| JP | 09-162090 A | 6/1997 |
| JP | 11-233449 A | 8/1999 |
| JP | 2001-507525 A | 6/2001 |
| JP | 2002-016239 A | 1/2002 |
| JP | 2002-134375 A | 5/2002 |
| JP | 2002-519847 A | 7/2002 |
| JP | 2004-535664 A | 11/2004 |
| KR | 2004/057636 A | 7/2004 |
| WO | WO-9935674 A1 | 7/1999 |
| WO | WO 02/084721 A2 | 10/2002 |
| WO | WO-2005/034218 A2 | 4/2005 |

* cited by examiner

METHODS OF MAKING SUBSTRATE STRUCTURES HAVING A WEAKENED INTERMEDIATE LAYER

CROSS-REFERENCE TO RELATED APPLICATIONS

This application is a continuation-in-part application of prior application Ser. No. 10/574,120 filed May 31, 2007 now U.S. Pat. No. 8,062,564 which is the U.S. national stage application of international application PCT/FR2004/02398 filed Sep. 23, 2004. Also, this application is a continuation-in-part application of prior application Ser. No. 12/087,093 filed Dec. 1, 2008 now abandoned which is the U.S. national stage application of international application PCT/FR2006/002886 filed Dec. 27, 2006. The disclosures of all of these prior applications are incorporated herein by reference in their entireties.

FIELD OF THE INVENTION

The present invention generally relates to the field of semiconductor fabrication, and particularly to the field of fabrication of composite semiconductor substrates comprising an insulating layer interposed between two semiconductor substrates or wafers, and even more particularly to the field of fabrication of such structures where the semiconductor substrates or wafers are detachable.

BACKGROUND OF THE INVENTION

In the micro-technology field, especially the field of microelectronics, power electronics, optoelectronics and MEMS-type components, it is known to use composite substrate structures comprising silicon wafers bonded to an insulating layer of the SOI type Methods for fabricating such composite structures are known in the art. Certain known methods form an insulating layer internal to a substrate by implanting oxygen species through the face the substrate. Certain other known methods split or cleave a thin semiconductor layer from a donor substrate at a zone of weakness within the donor substrate and then transfer the thin layer onto a support substrate having a surface insulating layer.

Different techniques for forming such zones of weakness are known in the art. In one such technique, the zone of weakness is formed within the donor substrate by the implantation of atomic species through the face of the donor substrate. In another such technique, the zone of weakness is a porous layer within the donor substrate. This porous layer is formed by, first, performing a wet electrochemical process to make the surface of a substrate porous, and then by depositing the layer to be transferred onto the porous surface.

However, these known methods have various disadvantages. Those methods that require implantation can damage the crystal structure of material being implanted. Those methods that require forming a porous layer by electrochemical means necessarily require immersion in a solution which can lead to contamination.

SUMMARY OF THE INVENTION

This invention provides composite semiconductor substrates and methods for fabricating such composite structures that do not require implantation of atomic species or wet electrochemical processing.

In one embodiment, an initial composite structure includes a semiconductor substrate, a semiconductor superstrate and an intermediate layer interposed between the substrate and the superstrate. The semiconductor materials of the substrate and/or the superstrate may be silicon, compounds of III-V class, silicon carbide (SiC), gallium nitride (GaN), and the like. The intermediate layer is preferably of a glass-type material that undergoes a structural transformation when subject to a suitable heat treatment. In a preferred structural transformation, the glass-type material becomes spongy or porous, being filled with numerous micro-bubbles or micro-cavities containing a gaseous phase.

In one embodiment, the methods of the invention, first, fabricate an initial composite structure by depositing an intermediate layer on the surface of the substrate and then by bonding the superstrate to the intermediate layer so that the intermediate layer is interposed between the substrate and the superstrate. Then, the methods apply a suitable heat treatment so that the intermediate layer becomes spongy or porous, being filled with numerous micro-bubbles or micro-cavities containing the gaseous phase.

In another embodiment, the initial composite structure includes a semiconductor substrate and an intermediate layer on the surface of the substrate, and is fabricating by, preferably, depositing the preferred glass-type material on the substrate. The methods of this invention, then, apply a suitable heat treatment to the substrate and intermediate layer so that the intermediate layer undergoes the preferred structural transformation and becomes spongy or porous. Finally, the methods bond a superstrate to the structurally-transformed intermediate layer.

The preferred glass-type material comprises silicon oxides doped with the oxides of phosphorous so that the concentration of phosphorus is in the range from about 6% to about 14%. The silicon oxide doped can also be doped with the oxides of boron so that the concentration of boron is up to about 4%.

Further aspects of the present invention include:

The suitable heat treatment can be applied so that the intermediate layer and/or the composite structure does not split.

A thermal oxide film can be provided on the surface of the substrate, or of the superstrate, or of both, that acts to enhance bonding to the intermediate layer and/or to limit diffusion from the intermediate layer.

During the preferred structural transformation, the intermediate layer can become spongy due to the formation of the microbubbles or microcavities that comprise within themselves a gaseous phase, and preferably an irreversibly formed gaseous phase.

The suitable heat treatment can be applied so that at least some of the microbubbles or microcavities coalesce to form channels extending through the intermediate layer.

The suitable heat treatment can be applied in a temperature range so that the intermediate layer becomes plastically deformable.

During the preferred structural transformation as the intermediate layer becomes spongy, the thickness of the intermediate layer can increase.

The thickness of the intermediate layer subsequent to heat treatment can be between about 2 and about 4 times the thickness prior to heat treatment.

The suitable heat treatment can be carried out at a temperature in the range from 900° C. to 1200° C.

Forces can be applied to the composite structure to bring about splitting of the superstrate from the substrate at the intermediate layer, wherein the forces can be applied by a blade or water jet that is directed at the intermediate layer.

The intermediate layer can be chemically attacked so that it is at least partially removed.

The first and second semiconductor materials can be the same or different.

According to a further embodiment, the invention provides a composite semiconductor structure produced by the methods of the invention and having a substrate of a monocrystalline semiconductor material, a superstrate of a monocrystalline semiconductor material, and an intermediate layer interposed between the substrate and the superstrate and comprising a glass material, preferably a phosphosilicate or a borophosphosilicate glass material, with a spongy or porous structure and a thickness between one and ten microns. The superstrate can have a thickness less than one micron.

The composite semiconductor substrates with structurally-transformed intermediate layers have numerous applications, especially for the fabrication of MEMS devices, microelectronic circuits and optoelectronic components.

It should be understood that throughout the foregoing text and in the appended claims, the term "substrate" and the term "superstrate" may replace each other. Specifically, although the composite structures of this invention are described herein in terms of lower and upper portion, or bottom and top portions, or "substrate" and "superstrate" portions, the identification of a particular portion of a substrate as the lower portion (or the bottom portion, or the substrate portion) and of the other portion of the substrate as the upper portion (or the top portion, or the superstrate portion) is essentially arbitrary and for convenience of description only. Either portion of a composite structure can be identified as upper or lower (or top or bottom, or substrate or superstrate) as is convenient in a particular application.

Stated differently, according to one embodiment, the lower portion of a composite substrate may be considered as a support and subsequent treatments may be carried out on the upper portion, or alternatively and according to another embodiment, the upper portion may be considered as a support and subsequent treatments may be carried out on the lower portion. It would also be possible to combine these two embodiments.

Further aspects and details and alternate combinations of the elements of this invention that will be apparent to those of skill in the art from the following detailed description are also within the scope of the inventor's invention.

BRIEF DESCRIPTION OF THE DRAWINGS

The present invention may be understood more fully by reference to the following detailed description of the preferred embodiment of the present invention, illustrative examples of specific embodiments of the invention and the appended figures in which.

In all figures, corresponding elements are identified by the same reference numbers and letters. The figures are not drawn to scale.

DETAIL DESCRIPTION OF THE PREFERRED EMBODIMENTS

Preferred embodiments of the invention are now described. It should be understood that the preferred embodiments are not limiting, and other embodiments that will be apparent to those of skill in the art from study of this specification and the accompanying figures are intended to be within the scope of the appended claims.

This invention provides methods for the fabrication of unique composite semiconductor substrate structures.

Figure 3A:
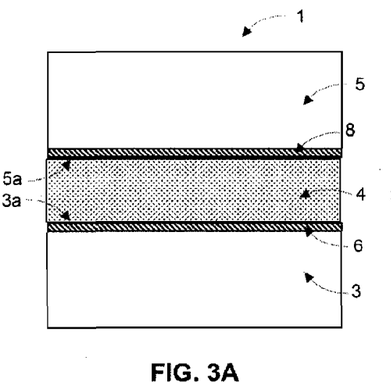
FIGS. 3A-B illustrate an earlier step in the preferred methods of this invention.
Figure 3B:
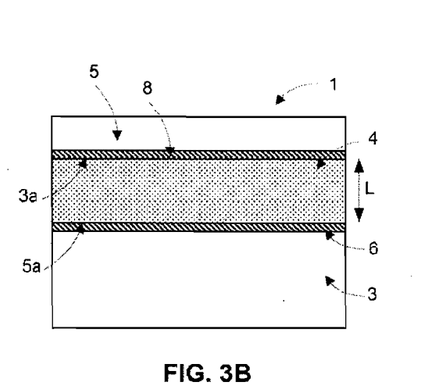

The unique composite structures fabricated by the provided methods comprise, at least, lower and upper portions (also referred to herein as "substrate" portions and "superstrate" portions, or simple as "substrates" and "superstrates") and an intervening intermediate layer, the intermediate layer having a composition and structure selected so as to undergo a particular structural transformation when subject to a suitable heat treatment. FIGS. 3A and 3B illustrate exemplary composite substrate structures 1 of the invention prior to such heat treatment according to one preferred embodiment of the provided methods. Illustrated structures 1 have lower portions (substrates) 3 and upper portions (superstrates) 5 in the form of semiconductor wafers, and also have intermediate layer 4 interposed between the lower and upper portions.

Prior to describing the preferred methods, the compositions and materials of the various layers of the composite semiconductor substrate structures are described.

The substrate and superstrate wafers are generally, at least, polycrystalline, and preferably, monocrystalline. They can comprise the same or different semiconductor materials, which can include elemental semiconductor materials, e.g., diamond, Si and Ge; alloy semiconductor materials, e.g., $Si_xGe_{1-x}$; compound semiconductor materials, e.g., compounds (GaN) and silicon carbide (SiC), and so forth. Substrates generally have thicknesses of several hundred up to a thousand of more microns. Superstrates can have a wide range of thicknesses, e.g., from a fraction of a micron as in FIG. 4B, up to a thousand of more microns as in FIG. 4A.

Most generally, the intermediate layer comprises at least one base material in which extrinsic atoms or molecules (dopants) are distributed, extrinsic atoms or molecules being different from the atoms or molecules of the base material. The extrinsic atoms and molecules are preferably in chemical association with the base material, but may also be only in physical association, e.g., for example, by being dissolved in the base material. Preferably, the intermediate layer is electrically insulating.

The composition of the intermediate layer, that is atoms and molecules of the base and dopant materials, must be chosen so that a suitable heat treatment can induce a structural transformation which weakens the intermediate layer either mechanically and/or chemically and/or thermally. A preferred structural transformation for weakening the intermediate layer comprises the irreversible formation numerous micro-bubbles or micro-cavities containing a gaseous phase. An intermediate layer with numerous micro-bubbles or micro-cavities is referred to herein as being "spongy" or "porous." The transformation is irreversible in that the micro-bubbles or micro-cavities remain upon cooling; the intermediate layer does not revert to its prior structure.

The structural transformation induced by the heat treatment should not split, fracture, fragment, or the like, the intermediate layer. Preferably, the intermediate layer becomes plastically deformable so that it can accommodate formation of the gaseous phase and of the micro-bubbles and micro-cavities by smoothly and continuously weakening, deforming and flowing without splitting, fracturing or fragmenting.

In preferred embodiments, the weakening and deformation of the intermediate layer due to the formation of the micro-bubbles and micro-cavities layer is reflected by an increase of its thickness. For example, its thickness can increase up to 1.5 times, or up to 2 times, or up to 3 times, or even up to 4 times. The intermediate layer thickness can, therefore, increase from about 5 micron up to about 7.5 microns, or to about 10, or to about 15, or to about 20 microns during the course of the structural transformation. The quantity and volume of the micro-bubbles or micro-cavities, and thus the final increase of thickness, depends on the composition of the intermediate layer and the conditions of the heat treatment applied. For example, a heat treatment of longer duration may cause a greater increase of thickness than a heat treatment of shorter duration.

It is believed that the structural transformation and the gaseous phase within the micro-bubbles and micro-cavities preferably form during the suitable heat treatment de novo within the intermediate layer, perhaps consequent to chemical transformation of the materials of the intermediate layer. It is also possible that it forms consequent to diffusion of gases already present in the intermediate layer, or other mechanism.

But, formation of the gaseous phase does not depend on prior implantation of atoms or molecules, e.g., implantation of H or He atoms. Although formation of the gaseous phase may be enhanced by prior atomic or molecular implantation, such prior implantation is not required. But if there should be prior implantation, it is important that it should be controlled so that the heat treatment does not lead to splitting of the intermediate layer.

Regardless of the mechanism involved, what is important in this invention is the character of the accompanying structural transformation.

In summary, preferred materials for the intermediate layers of this invention undergo structural transformation during a suitable heat treatment so as to become irreversibly spongy or porous, being filled with numerous micro-bubbles or micro-cavities containing, at least initially, a newly-formed gaseous phase. Preferred materials also become plastically deformable at the temperatures of suitable heat treatments so that the micro-bubbles, micro-cavities and gaseous phase are accommodated smooth deformation without splitting, fracturing or fragmenting. For example, the thickness of the intermediate layer can increase even up to several fold, the exact increase depending on the composition of the intermediate layer and on the conditions of its deposition and heat treatment.

Suitable preferred materials generally include various glasses which become spongy or porous, perhaps due to the formation of gaseous phases, and also, preferably, which become plastically deformable at temperatures typically of standard semiconductor heat treatments, e.g., at temperatures no greater than about 1100-1200° C. Preferred glasses comprise silicon oxides doped with high percentage of the oxides of phosphorous and/or boron; in other words, preferred glasses are of the phosphosilicate glass (PSG) or borophosphosilicate glass (BPSG) type. Preferred PSG or BPSG glasses are doped so that the phosphorus percentage is between about six and about fourteen and the boron percentage is between about zero and about four. Alternatively, the glasses can comprise mixtures of other oxides known to be useful in glasses.

Preferred PSG or BPSG-type glasses can be routinely deposited using known depositional techniques, e.g., CVD, LPCVD or PECVD, in readily available deposition chambers at relatively low temperatures, e.g., about 400° C. Intermediate layers comprising such glasses are preferably between about 1-10 microns, or between about 1.5-5 microns thick, or about 1.5 microns thick. Preferred PSG or BPSG-type glasses can also be routinely deposited by spin-on techniques in which a glass-containing, slurry-type liquid is spread evenly over the surface of a substrate by rapid spinning. The slurry may then be consolidated by an optional low-temperature heat treatment, e.g., between about 200 and about 600° C. An intermediate layer formed in this fashion may initially be somewhat porous, and the subsequent heat treatment may increase this initial porosity by forming bigger and/or more numerous micro-bubbles and micro-cavities.

Suitable heat treatments necessary for formation of the micro-bubbles or micro-cavities in these preferred glasses and necessary for achieving their plastic deformability can be carried out at temperature less than about 1200° C. in order to be compatible with routine semiconductor processing. For example, preferred heat treatment temperatures are between about 900° C. and about 1100° C.

Figure 4A:
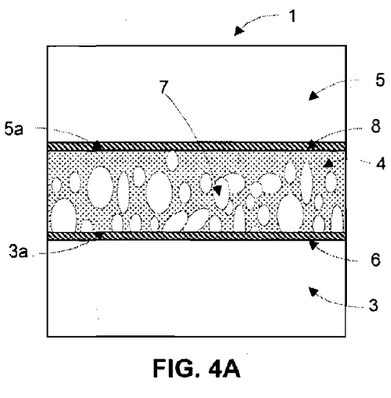
FIGS. 4A-B illustrate a later step in the preferred methods of this invention.
Figure 4B:
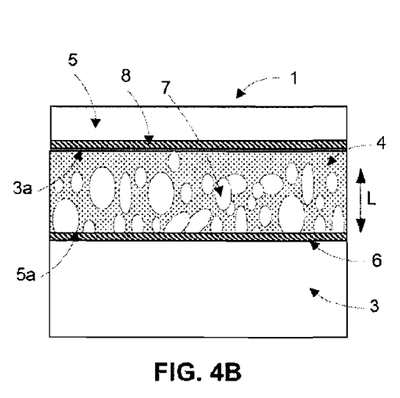
Figure 5:
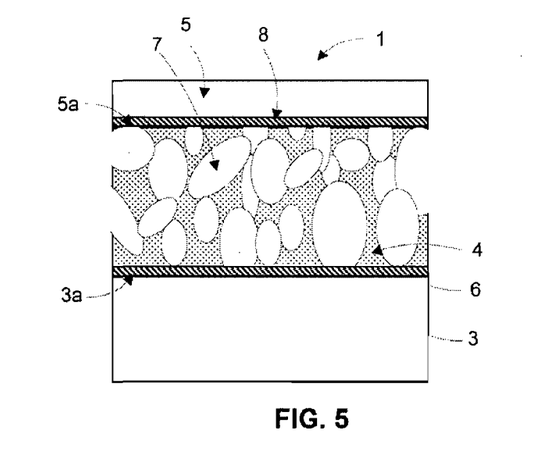
FIG. 5 illustrates an optional step in the preferred methods of this invention.

Structurally-transformed intermediate layers are illustrated in FIGS. 4A-B and 5. FIGS. 4A-B illustrate composite substrate structures 1 after suitable heat treatment, and can be compared with FIGS. 3A-B, which illustrate the same structures prior to heat treatment. It is apparent that structurally-transformed intermediate layer 4 has become spongy or porous, being filled with numerous newly-formed micro-bubbles or micro-cavities 7. FIG. 5, in comparison to FIG. 4B, illustrates an intermediate layer 4 with an even greater number of even larger micro-bubbles and micro-cavities, that is with an increased porosity or sponginess, and with a considerably increased thickness. The differences between FIGS. 4B and 5 may result from difference in the compositions of the intermediate layers and/or from differences in heat treatment conditions. For example, FIG. 5 may simply be the result of a heat treatment of greater duration than the heat treatment leading to FIG. 4B.

Figure 6:
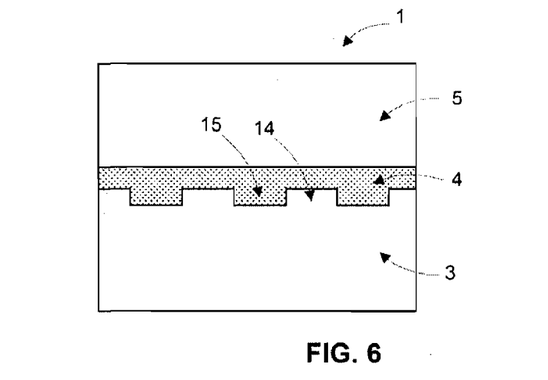
FIG. 6 illustrates another optional step in the preferred the methods of this invention.

Indeed, in certain applications, it can be advantageous for the micro-bubbles or micro-cavities 7 to grow to such numbers and volumes that, as in FIG. 5, they open onto the underlying surfaces 3a and 5a of the substrate 3 and/or superstrate 5, and/or also open onto the exterior, lateral edges of the intermediate layer, and/or also overlap and coalesce internally to the intermediate layer to form bubbles and cavities of macroscopic dimensions. In such cases, the coalesced micro-bubbles or micro-cavities can form channels that extend completely through the intermediate layer 4 from one lateral edge to the other lateral edge. Formation of such through channels may be facilitated by projecting rectilinear ridges and recessed notches etched into the surface of either or both of the substrate or the superstrate. FIG. 6 illustrates exemplary substrate 1 prior to heat treatment in which substrate 3 comprises such ridges 14 and notches 15.

Finally, the composite semiconductor substrate structures of this invention can also optionally, but preferably, have thin films (also referred to herein as bonding or buffer layers) on the surfaces of the lower (substrate) and/or upper (superstrate) portions that are adjacent to the intermediate layer. These films are advantageous because they can serve to promote bonding of the substrate and the superstrate, and also because they can act as diffusion barriers limiting the diffusion of materials, e.g., dopants such as B and/or P, from the intermediate layer into the adjacent semiconductor materials. In the case of substrates and superstrates comprising Si, such films, preferably, comprise thermally formed silicon oxide and are between about 0.5 and 3 microns thick, e.g., about 0.5 microns thick.

The composite substrates of this invention after heat treatment, examples of which are illustrated in FIGS. 4A-B and 10A-B, have, at least, the following desirable properties. First, the intermediate layer is sufficiently weakened that the composite substrates can be readily separated without fracturing into the individual substrates and superstrates by applying sufficient force or energy localized at the intermediate layer. Second, on the other hand, the intermediate layer and its interfacial bonds to the substrate and to the superstrate remain sufficiently strong so that the composite substrate structure can be subject to subsequent mechanical and/or chemical and/or electromechanical and/or electrochemical and/or mechano-chemical and/or thermal treatments in accordance with the processes normally used in microelectronics without however causing the composite substrate to separate, or without otherwise degrading too significantly the intermediate layer 4 and said interfacial bonds. Such processes can include thinning of the superstrate.

Turning next to the preferred methods of this invention, the composite substrate structures are fabricated from the above-described materials generally by assembling or bonding a semiconductor substrate, or lower portion, wafer to a semiconductor superstrate, or upper portion, wafer, where, prior to bonding, an intermediate layer of the preferred composition has been deposited on the substrate (optionally on the superstrate). These methods have several preferred embodiments, which differ primarily in whether the substrate and the superstrate are assembled and bonded together prior to the suitable heat treatment or subsequent to the suitable heat treatment. An number of possible optional steps define various alternatives of the preferred embodiments.

Figure 1:
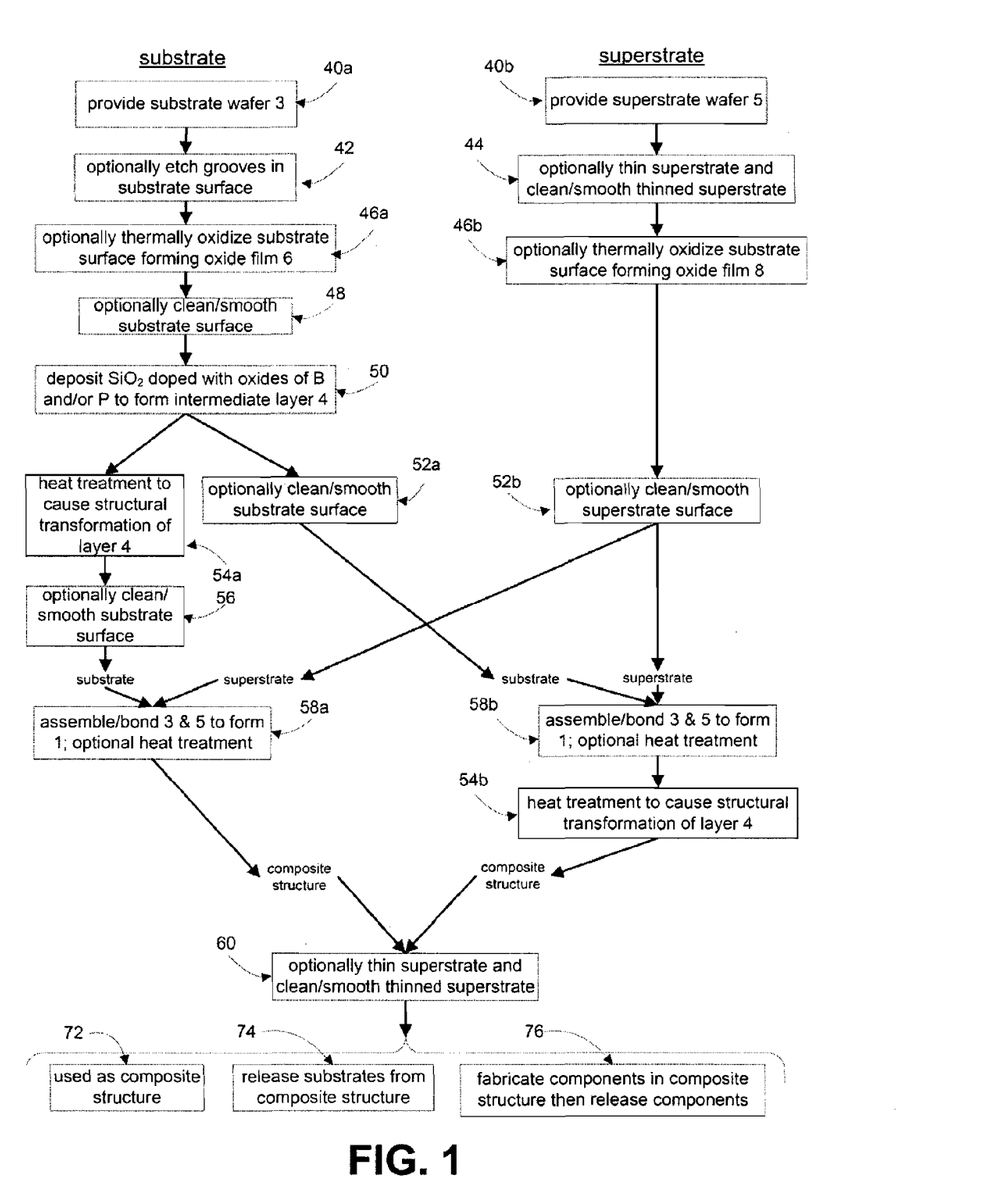
FIG. 1 illustrates preferred methods of fabricating composite substrate structures of the invention.

FIG. 1 illustrates the preferred embodiments of the methods of this invention. In this figure, most of the steps on the left apply to substrates, and most the steps on the right apply to superstrates. Several of these steps perform similar processing in the two cases, and such pairs of corresponding steps are indicated by using the same reference number with "a" appended for the substrate steps or with "b" appended for the superstrate steps. For example, the following are pairs of corresponding steps: 40a and 40b, 46a and 46b, 52a and 52b, 54a and 54b, 56a and 56b, and 58a and 58b.

Figure 2A:
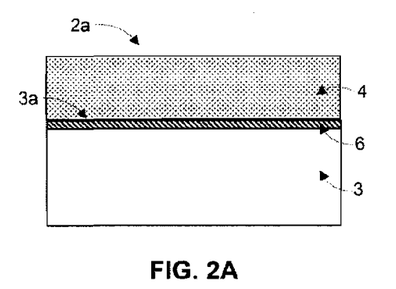
FIGS. 2A-B illustrate an exemplary substrate and an exemplary superstrate.
Figure 2B:
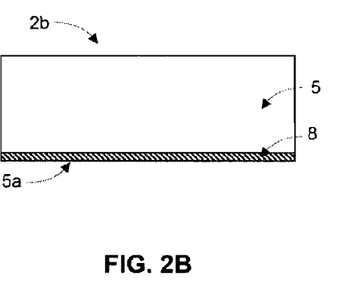

Generally, the preferred embodiments, first, prepare substrates and superstrates for assembly into a composite structure. The preparatory processing of substrates includes steps 40a, 42, 46a, 48 and 50; the preparatory processing of superstrates includes steps 40b, 44, 48b and 52b. FIGS. 2A and 2B illustrate an exemplary substrate 2a and an exemplary superstrate 2b at the completion of this initial processing.

Next, a first preferred embodiment uniquely includes: steps 52a and 52b, which prepare the substrate and superstrate for assembly and bonding; step 58b, which bonds the substrate and superstrate into a composite structure; and 54b, which subjects the composite structure to a suitable heat treatment. FIGS. 3A-B, 4A-B and 5 illustrate the steps of this first preferred embodiment.

Figure 7:
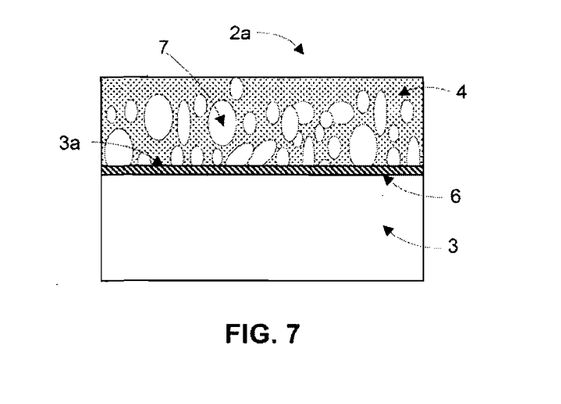
FIG. 7 illustrates an alternative earlier step in the preferred methods of this invention.
Figure 10:
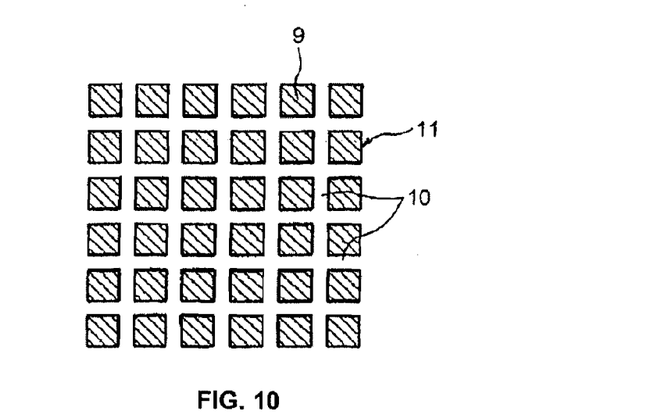
FIG. 10 illustrates another use of the composite substrate structures of this invention.

A second preferred embodiment uniquely includes: steps 54a, which subjects the prepared substrate to a suitable heat treatment; step 56, which prepares the heat-treated substrate for assembly and bonding; and step 58a, which bonds the substrate and superstrate into a composite structure. FIGS. 7 and 10A-B illustrate the steps of this second preferred embodiment.

Finally, the composite structure produced by both embodiments can optionally be further processed in step 60, and can have numerous uses, some of which are steps 72, 74 and 76 and illustrated in FIGS. 11-15.

Turning now to preparatory processing of the substrate, in step 40a, an appropriate substrate is provided or selected that is in the form of a wafer, e.g., substrates 3 in FIGS. 2A and 7. Preferred wafers can have thicknesses of several hundred microns, e.g., from five hundred to a thousand microns, and diameters of a few hundred millimeters, e.g., from 100 to 300 millimeters. Although, as described, preferred wafers may comprise a variety of semiconductor materials, e.g., Si, Ge, III-V compounds, and so forth, without limitation and for convenience, the invention is described in the following largely in terms of Si substrates and superstrates.

Next, in optional step 42, projecting ridges, preferably rectilinear, are formed (most often by etching) in the surface of the substrate. FIG. 6 illustrates a transverse slice through composite substrate structure 1 of the invention having substrate 3, superstrate 5 and intermediate layer 4 (in this structure, the optional oxide films to be described subsequently are absent). Here, the surface of substrate 3 has been etched to have projecting, rectilinear ridges 14 bounding notches 15.

These projecting ridges and rectilinear notches may, as has been described above, facilitate the appearance and coalescence of micro-bubbles or micro-cavities into channels running lengthwise along the notches during the subsequent (thermally induced) structural transformation of the intermediate layer. In certain embodiments, the channels run from one lateral edge of the intermediate layer to the other lateral edge so as to extend entirely through a composite substrate structure of the invention. Such channels may serve as conduits to conduct fluid through the composite substrate structure.

Next, in optional but preferred step 46a, a thin film of material is provided on the surface of the substrate, e.g., thin film 6 (referred to as a bonding or a diffusion barrier layer) in FIGS. 2A and 7. The composition of this thin film is selected to promote bonding and attachment to, and to prevent diffusion between, the substrate and the adjacent intermediate layer. In cases where the substrates comprise Si, such a film preferably comprises (undoped) silicon oxides, for example, a silicon oxide layer with a thickness between about 0.5 and 3 microns, and more preferably, a thickness of about 0.5 microns. Such silicon oxide layers can be conveniently produced by surface oxidation in a furnace at a temperature in the range from 900° C. to 1100° C., or alternatively, can be produced by depositing silicon oxide by known deposition techniques. Instead of silicon oxide, this film can also comprise silicon nitride, or silicon oxynitride or the like.

Next, in optional step 48, it may be advantageous to clean and/or smooth the thin film 6 prior to depositing the intermediate layer. Cleaning can performed as is known in the art, such as by a chemical cleaning, e.g., by an RCA-type cleaning process. Smoothing can also performed as is known in the art, such as by a chemical/mechanical polishing (CMP) type smoothing process. It can be advantageous to perform multiple similar cleaning/smoothing steps at different stages during the methods of this invention.

Next, in step 50, the intermediate layer is deposited or otherwise formed on the surface of the substrate wafer 3. FIG. 2A illustrates substrate 2a with wafer 3, bonding or barrier layer 6 and intermediate layer 4. FIG. 6 illustrates an assembled structure with substrate 3, superstrate 5 and intermediate layer 4, but without any bonding or barrier layers.

The characteristics and compositions of the intermediate layer have been already discussed in detail. Generally, the intermediate layer comprises silicon oxide doped with the oxides of phosphorous and/or boron so as to form glasses of the phospho-silicate (PSG) or boro-phospho-silicate (BPSG) type. The percentage of phosphorus in the material constituting the intermediate layer 4 is preferably be in the range from 6 to 14, and the percentage of boron is preferably in the range from 0 to 4. The intermediate layer can be deposited by routine CVD, LPCVD or PECVD type techniques in commercially available deposition chambers preferably at about 400° C. to a depth of between about one and ten microns, and preferably between about one and five microns, for example, to a depth of five microns.

In a particular preferred embodiment, the intermediate layer can comprise a phosphosilicate glass (PSG) containing about 6.5% phosphorus, and can be deposited in a PECVD deposition machine at 400° C. to a thickness close to 1.5 microns.

Turning now to preparatory processing of the superstrate, first, in step 40b, an appropriate superstrate wafer is provided or selected, which, as in step 40a, can have a diameter of a few hundred millimeters and can comprise a variety of semiconductor materials, e.g., Si, Ge, III-V compounds, and so forth. The substrate and the superstrate may be of the same of different semiconductor materials. Without limitation and for convenience, the invention is described in the following largely in terms of superstrates comprising Si.

The thicknesses of the substrate and superstrate wafers often differ. In certain applications, the superstrate wafer advantageously has a thickness comparable to that of the substrate wafer, e.g., several hundred microns up to a thousand or more microns. However, for many other applications, e.g., MEMS devices, microelectronic circuits and opto-electronic components, a thin superstrate, that is one with a thickness of a fraction of a micron up to a few tens of microns, can be more advantageous. FIGS. 3B, 4B and 10B illustrate composite substrate structures with thin superstrates (that is, with superstrates that are thinner than the substrates to which they are bonded).

Composite substrates with thin superstrates can be fabricated by starting with initial superstrate wafers of suitable thinness. Alternatively, they may be fabricated by starting with a superstrate wafer of standard thickness and then by subsequently thinning the superstrate, either before the heat treatment (as in step 44) or after the heat treatment (as in step 60). An initially thicker superstrate wafer can be thinned by known grinding, chemical attack or chemical-mechanical polishing techniques.

An additional thinning technique is to split or cleave a thin superstrate from an initial donor wafer at a zone of weakness, for example, a zone of weakness defined by the implantation of atomic species according to, e.g., the commercially-known SMART-CUT® techniques. For example, an internal zone of weakness may be produced by the ionic implantation of protons into the surface of a donor wafer at a dose of the order of $5 \times 10^{16}$ cm$^{-2}$. Then, a thin surface layer can be cleaved or split from the donor substrate at the internal zone of weakness and transferred and bonded onto the prepared surface of an intermediate layer on a substrate. Alternatively, the donor substrate itself with its internal zone of weakness can be bonded onto the prepared surface of an intermediate layer on a substrate, and then the bulk of the donor substrate cleaved at the internal zone of weakness so that only the thin surface layer is left bonded to the prepared substrate and intermediate layer. Both these techniques are well known in the art.

Subsequent to this optional thinning, it may be advantageous to clean and/or smooth the thinned superstrate surface.

Next, in optional but preferred step 46b, a thin film of material is provided on the surface of the superstrate, e.g., thin film 8 in FIG. 2B, to act as a bonding layer or as a diffusion barrier layer. The composition of this thin film as well as its characteristics and method of deposition are similar to those of thin film 6 already described above with respect to corresponding step 46a.

Finally, in alternative embodiments, grooves may also be etched in the surface of the superstrate, as has been described in the case of the substrate with respect to step 42. Also, the intermediate layer can be deposited on the superstrate, as has been described in the case of the substrate with respect to step 48. Further, a portion of the intermediate layer may be deposited on both the substrate and on the superstrate.

The further processing steps differ between the preferred embodiments. A first preferred embodiment is described next. It includes steps 52a and 52b, 58b and 54b, which are illustrated in FIGS. 3A-B, 4A-B, 5 and 6. After the first preferred embodiment, a second embodiment is described. It includes steps 54a, 56 and 58a, which are illustrated in FIGS. 7 and 10A-B.

Turning to the first preferred embodiment, in step 58b, substrate 2 and superstrate 3 are assembled by contacting surface 5a of thin film 8 on superstrate 5 to intermediate layer 4 and by bonding the thin film and the intermediate layer. FIG. 3A illustrates the resulting composite substrate structure in the case where the thicknesses of superstrate 5 and of the substrate 3 are comparable; and FIG. 3B illustrates the case where the thickness of superstrate 5 is less than, perhaps considerably less than, the thickness of the substrate 3.

A preferred bonding technique is direct, molecular wafer bonding, which arises when two clean, flat, and, preferably, hydrophilic surfaces are brought into close contact. Accordingly, in steps 52a and 52b, the surfaces to be bonded are optionally, but preferably, smoothed and cleaned. Smoothing can performed as is known in the art, e.g., by a chemical/mechanical polishing (CMP) type smoothing process. Cleaning can performed as is known in the art, such as by a chemical cleaning, preferably by a chemical cleaning which increases the hydrophilic nature of the cleaned surface, e.g., by an RCA-type cleaning process. Molecular wafer bonding can optionally be facilitated by the application of force, preferably point bearing forces, between the substrate 2 and the superstrate 3.

The interfacial bonding energy of the surfaces being molecularly bonded together can be increased by an optional, but, preferable, consolidating heat treatment applied to the assembled structure 1. Such a heat treatment can be, for example, at a temperature between 200° C. and 1200° C. for two hours and in an argon and oxygen or nitrogen atmosphere.

Since the primary purpose of this consolidating heat treatment is only to increase the bond energy at the bonding interface between face 8 and intermediate layer 4 of structure 1, the heat treatment conditions are preferably selected to achieve this bonding-energy increase without also inducing unwanted structural transformation in the intermediate layer 4, i.e. the formation of micro-bubbles or micro-cavities, as has been described above. However, as the following step is the actual structurally-transforming heat treatment, the consolidating heat treatment may possibly initiate some degree of structural transformation of the intermediate layer.

Other bonding techniques could be employed, for example anodic bonding or bonding by use of an intermediate adhesive layer. Such alternate techniques would typically require that the bonding/barrier films 6 and 8 be other than silicon dioxide and that the conditions of bonding be different.

Next, in step 54b, the bonded structure comprising the substrate, the superstrate and the intermediate layer, e.g., bonded structure 1 of FIGS. 3A or 3B, is subject to a structurally-transforming heat treatment in a furnace. As already described, the conditions of the heat treatment are selected in view of the composition of the intermediate layer so as to cause a structural transformation of the intermediate layer to a spongy or porous form comprising numerous micro-bubbles and/or micro-cavities, preferably comprising a gas phase.

The composition of the intermediate layer is preferably further selected so that, at the temperature range of such a heat treatment, the intermediate layer becomes, at least, sufficiently weakened or plastic so that the micro-bubbles and/or micro-cavities that form can be accommodated by an increase in the thickness of the intermediate layer without fracturing or fragmenting. More preferably, the intermediate layer becomes weakened by becoming plastically deformable to more smoothly and continuously accommodate the forming micro-bubbles and/or micro-cavities by an increases in thickness. As an example, starting from five microns, after treatment, the intermediate layer may have a thickness in the range from fifteen to twenty microns.

During this heat treatment, films 6 and 8, e.g., thermal oxide films 6 and 8, on the surfaces of substrate 3 and superstrate 5, respectively, preferably act as a barrier for limiting or preventing the diffusion of species, e.g., phosphorus and/or boron, from the intermediate layer 4 and into the substrate or the superstrate.

FIGS. 4A-B illustrate the results of this structural transformation. Here, exemplary bonded structure 1 of FIG. 4A illustrates the results of subjecting the exemplary bonded structure 1 of FIG. 3A to a sufficient heat treatment; similarly, structure 1 of FIG. 4B illustrates the results of heat treating structure 1 of FIG. 3B. Numerous micro-bubbles and/or micro-cavities 7 have formed within intermediate layer 4. The increase in the thickness of this layer is illustrated by means of the comparison ruler L.

The quantity and volume of the micro-bubbles or micro-cavities 7 formed depend on the composition of the intermediate layer 4 and the conditions of the heat treatment applied to the structure 1. Certain compositions of the intermediate layer or longer durations of heat treatments can lead to more and bigger micro-bubbles or micro-cavities. For example, comparing structure 1 of FIG. 4B with structure 1 of FIG. 5 illustrates, in an exemplary manner, the more numerous micro-bubbles or micro-cavities that result from a longer duration heat treatment.

It can be appreciated, especially from FIG. 5, that the micro-bubbles or micro-cavities may be formed in such numbers and with such volumes that they can open onto the faces of the substrate and/or the superstrate adjacent to the intermediate layer, and, even more, can overlap and partially coalesce so as to form channels through the intermediate layer. Furthermore, if the micro-bubbles or micro-cavities become even more numerous, these channels can open to the lateral side ends of the intermediate layer so as to extend entirely through this layer. As discussed above, such channel formation may be facilitated by rectilinear projections and notches in the face of the substrate and/or the superstrate. FIG. 6 illustrates such rectilinear projections 14 and notches 15 prior to the formation of any micro-bubbles or micro-cavities.

In the case of intermediate layers of preferred glasses, e.g., PSG or BPSG, a sufficient heat treatment can be carried out at a temperature between about 400° C. and about 1200° C., preferably between about 900° C. and about 1200° C., and more preferably between about 900° C. and about 1100° C. In particular, the heat treatment may be carried out at a temperature close to 950° C. for two hours in an argon and oxygen atmosphere or in a nitrogen atmosphere.

Turning to the second preferred embodiment, the first step of this embodiment, heat treatment step 54a, is closely similar to the heat treatment step of the first embodiment, step 54b. The principal difference between the two embodiments being that, in the second embodiment, it is only the substrate with an intermediate layer that is subject to the heat treatment (and not the bonded structure with an overlying superstrate). Accordingly, the conditions of step 54a are closely similar to those already described with respect to step 54b, that is they are selected in view of the composition of the intermediate layer so as to cause a structural transformation in which the intermediate layer becomes spongy or porous because of the formation of numerous micro-bubbles and/or micro-cavities believed to contain a newly-formed gas phase. However, in the absence of an overlying superstrate during heat treatment in the second embodiment, extra care may be required in controlling the temperature and duration to avoid splintering, fragmenting or fracturing the surface of the intermediate layer. For example, it may be advantageous to restrict the structural transformation so that is does not proceed to the extent illustrate in FIG. 5

Substrate 2a of FIG. 7 illustrates the result of subjecting substrate 2a of FIG. 2a to step 54a.

Next, in step 56, the heat treated substrate is prepared for bonding with the superstrate. Since bonding is preferably argon by molecular, direct bonding, the preparation comprises a smoothing/cleaning step, the conditions of which can be closely similar to those of smoothing/cleaning steps 48, 52a and 52b, which have already been described. Prior to or subsequent to this cleaning/smoothing step, it may be advantageous, in this embodiment, to deposit (or grow) a bond-enhancing layer directly on the surface of the heat-treated intermediate layer. Such a layer may comprise, as with steps 46a and 46b, a layer of silicon dioxide with a thickness between about 0.5 and 3 microns, and preferably, about 0.5 microns.

Finally, in step 58a, the prepared and heat-treated substrate is bonded to the prepared superstrate in a manner that is closely similar to the bonding already described in step 58b. In particular, step 58a also preferably, but optionally, includes a consolidating heat treatment.

Figure 8A:
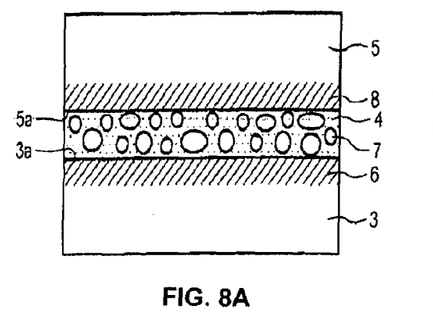
FIG. 8A-B illustrate an alternative later step in the preferred methods of this invention.
Figure 8B:
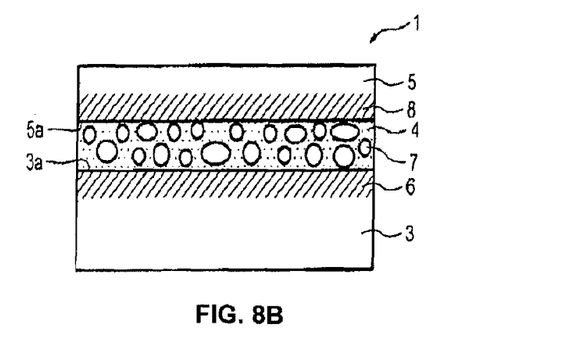

FIGS. 8A-B illustrate composite structures 1 produced according to the second embodiment. These structures are similar in relevant aspects to composite structures 1 illustrated in FIGS. 4A-B that are produced according to the second embodiment. In summary and as illustrated by these figures, these composite substrate structures comprise silicon substrate 2 and silicon superstrate 3 separated by intermediate layer 4 made of an electrically insulating material.

These intermediate layers of these composite structures are weakened because they contain micro-bubbles or micro-cavities 7. But, the intermediate layers and the interfacial bonds between intermediate layers 4 and substrate 3 and superstrate 5 remain sufficiently strong for subsequent mechanical and/or chemical and/or electromechanical and/or electrochemical and/or mechano-chemical and/or thermal treatments to be applied to structure 1 in accordance with the processes normally used in microelectronics.

Finally, these composite structure structures also comprise oxide films 6 and 8 which can constitute barriers for preventing the diffusion of species, in the example phosphorus and/or boron, between intermediate layer 4 and, on the one hand, substrate 3 and, on the other hand, superstrate 5 both during heat treatment steps 54a and 54b and also during subsequent applied treatments.

Additional processing steps may be carried out on these composite structures of either the first or second embodiments, where, in one alternative, substrate 3 is considered as a support and subsequent treatments are carried out on superstrate 5, or, in another alternative, the roles of the substrate and the superstrate are reversed.

Step 60 is one optional additional step comprising thinning the superstrate of the resulting composite structures. This step is advantageous in cases where the resulting composite structures are similar to composite structure 1 illustrated in FIGS. 4A and 8A, but where the desired composite structures are similar to those illustrated in FIGS. 3B and 8B, that is composite structure with thin superstrates, e.g., superstrates with thicknesses between about a fraction of a micron and about a few tens of microns. Such thinning can be carried out as described previously in connection with step 44. In particular, it can be carried out by known grinding, chemical etching or chemical-mechanical polishing techniques, and also may also be carried by a splitting/cleaving technique, for example by the SMARTCUT process. Finally, an optional trimming operation could also be carried out on the superstrate 5 so as to obtain edges of high quality.

Composite substrate structures 1 of FIGS. 4A-B and 10A-B have many applications some of which are now described.

For example, in step 72, these composite substrate structures may be used as-is for the production of electronic or opto-electronic integrated circuits on the silicon superstrate 3, mounted on a thick substrate 2 via the electrically-insulating intermediate layer 4. Advantageously, the capacitance between the superficial layer constituted by the superstrate 3 and the support layer constituted by the substrate 2 is particularly low because of the presence of micro-bubbles or micro-cavities 7.

Additionally, these composite substrates can be cooled by circulating a fluid between the substrate 2 and the superstrate 3 through the channels which can be optionally but intentionally created in the intermediate layer 4 by the coalescence of micro-bubbles or micro-cavities 7.

Further, in step 74, these composite structures can also be used as releasable structures. Micro-bubbles or micro-cavities 7 contained in intermediate layer 4 can sufficiently weaken the physical or chemical strength of this layer so that, by applying forces between substrate 2 and superstrate 3, the intermediate layer 4 may be caused to rupture thereby releasing substrate 2 and, optionally thin, superstrate 3, both of which may be individually used for further processing, for example, to produce electronic and/or opto-electronic circuits.

The force can be applied using any known means and, for example, by inserting a fine blade between the substrate 2 and the superstrate 3 or a jet of water under very high pressure. It is also possible to carry out a chemical attack of the intermediate layer 4 from its sides using, for example, a solution of hydrofluoric acids, which can readily progress between the substrate 2 and the superstrate 3 due to the presence of micro-bubbles or micro-cavities 7. To promote this chemical etching, it would be possible beforehand to produce holes in various locations in the substrate and/or in the superstrate, reaching the intermediate layer 4. The superstrate 5 can also be separated by a combination of a mechanical breaking action and chemical etching of the intermediate layer 4, and optionally by a thermal action.

Further, in step 76, these composite structures 1 can also be used for the production of electronic or optoelectronic or MEMS-type integrated circuits or components on the silicon superstrate 5 that are then separated at the intermediate layer.

Figure 9:
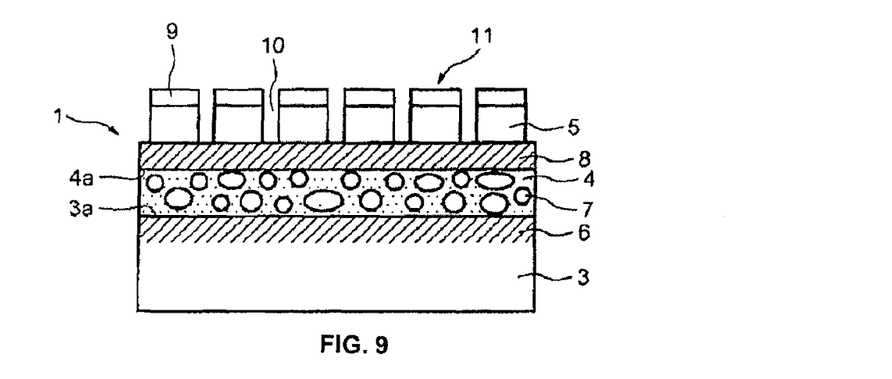
FIG. 9 illustrates a use of the composite substrate structures of this invention.
Figure 11:
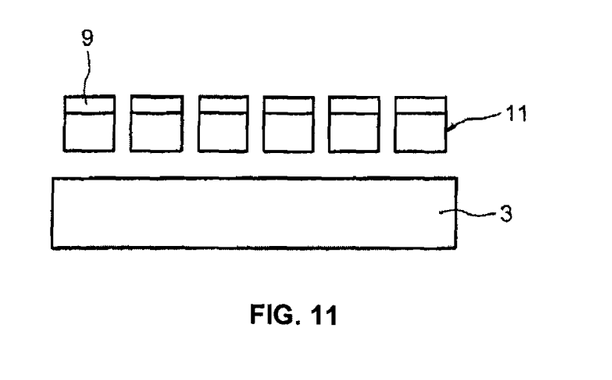
FIG. 11 illustrates another use of the composite substrate structures of this invention.

FIGS. 9, 10 and 11 illustrate one alternative for separating substrate 3 and superstrate 5 in which electronic, optoelectronic or MEMS components have been produced. As shown in FIGS. 9 and 10, components or circuits 9 arranged for example in a square matrix and spaced apart, may be produced, by any known process, on the thin or thinned superstrate 5. Grooves or other similar features 10 can also be produced which are arranged in two perpendicular directions, reaching the oxide layer 8 and allowing the chips 11 having the components or circuits 9 to be individually isolated, for example by suitable chemical etching. Next, as shown in FIG. 11, the structure 1 thus treated may be immersed in a suitable bath for chemically etching the intermediate layer 4 and the oxide layer 8 in such a way that the various chips 11 bearing the various components or circuits 9 are separated or individualized. This chemical etching is facilitated by the presence of the grooves 10.

Figure 12:
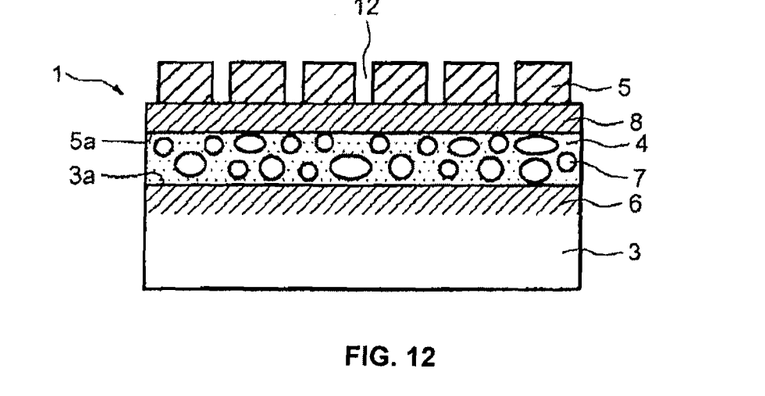
FIG. 12 illustrates another use of the composite substrate structures of this invention.
Figure 13:
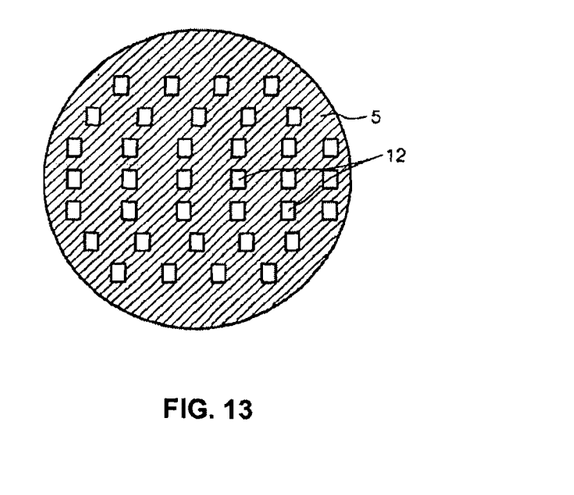
FIG. 13 illustrates another use of the composite substrate structures of this invention.

FIGS. 12 and 13 illustrate another alternative for separating substrate 3 and superstrate 5 in which electronic, optoelectronic or MEMS components have been produced. Through-holes 12 may be produced through the thin or thinned superstrate 5, reaching the oxide layer 8, these holes being arranged as is convenient one with respect to another. In one embodiment, the holes 12 may be rectangular and arranged in perpendicular lines so as to partly define volumes distributed in a square matrix. Next, the structure thus produced may be immersed in a bath for chemically etching the intermediate layer 4 in such a way that the superstrate 5 is separated and constitutes an apertured wafer. This chemical etching is facilitated by the presence of the holes 12.

Of course, the substrate 3 may be used again as support for a new superstrate 5. In another embodiment, the grooves, holes or etched features could also be produced through the oxide layer 8 and reach the intermediate layer 4.

The words "significant," "likely," and "about" (and similar words of degree) are used here to mean within acceptable and expected limits, usually commercially-acceptable limits. For example, the phrases "about 10%" or about "5 microns" are taken to mean that the quantity is 10% or the dimension is 0.5 microns within expected tolerances or within commercially-acceptable tolerances.

The preferred embodiments of the invention described above do not limit the scope of the invention, since these embodiments are illustrations of several preferred aspects of the invention. Any equivalent embodiments are intended to be within the scope of this invention. Indeed, various modifications of the invention in addition to those shown and described herein, such as alternate useful combinations of the elements described, will become apparent to those skilled in the art from the subsequent description. Such modifications are also intended to fall within the scope of the appended claims. In the following (and in the application as a whole), headings and legends are used for clarity and convenience only.

What is claimed is:

1. A method for fabricating a composite semiconductor structure, the method comprising:
providing an initial composite structure comprising at least one intermediate layer interposed between a substrate and a superstrate, the substrate and a superstrate comprising the same or different semiconductor materials, and the intermediate layer comprising a CVD-deposited glass material having a composition whereby, when subjected to a suitable heat treatment, the material undergoes a structural transformation becoming spongy; and
applying a suitable heat treatment to the initial composite structure at a temperature in the range from 900° C. to 1200° C. so that the as-deposited intermediate layer becomes spongy consequent to the structural transformation,
wherein the glass material comprises silicon oxide doped with phosphorous or silicon oxide doped with phosphorous and boron, and
wherein the spongy transformation comprises the formation of microbubbles or microcavities containing a gaseous phase.

2. The method of claim 1 wherein the conditions of the suitable heat treatment are selected so that the composite structure does not split.

3. The method of claim 1 wherein at least some of the microbubbles or microcavities coalesce to form channels extending through the composite structure.

4. The method of claim 1 wherein intermediate layer, at the temperature of the suitable heat treatment, becomes plastically deformable.

5. The method of claim 1 wherein, during application of the suitable heat treatment, the thickness of the intermediate layer increases.

6. The method of claim 5 wherein the thickness of the intermediate layer subsequent to the heat treatment is between about 2 and about 4 times the thickness prior to the heat treatment.

7. The method of claim 1 wherein the glass material comprises silicon oxide doped with phosphorous.

8. The method of claim 1 wherein the glass material comprises silicon oxide doped with phosphorous so that the concentration of phosphorus is in the range from about 6% to about 14%.

9. The method of claim 8 wherein the silicon oxide is further doped with boron so that the concentration of boron is up to about 4%.

10. The method of claim 1 further comprising reducing the thickness of the superstrate.

11. The method of claim 1 further comprising applying forces to the composite structure to bring about splitting of the superstrate from the substrate at the intermediate layer.

12. The method of claim 11 wherein the forces are applied by a blade or water jet that is directed at the intermediate layer.

13. The method of claim 1 further comprising chemically attacking the intermediate layer to at least partially remove the intermediate layer between the substrate and the superstrate.

14. A method for fabricating a composite semiconductor structure, the method comprising:
providing a substrate comprising a first semiconductor material;
CVD-depositing an intermediate layer on a surface of the substrate, the intermediate layer comprising a glass material having a composition whereby, when subjected to a suitable heat treatment, the material undergoes a structural transformation becoming spongy; and
applying a suitable heat treatment at a temperature in the range from 900° C. to 1200° C. to the substrate and as-deposited intermediate layer so that the intermediate layer becomes spongy consequent to the structural transformation,
wherein the glass material comprises silicon oxide doped with phosphorous or silicon oxide doped with phosphorous and boron, and
wherein the spongy transformation comprises the formation of microbubbles or microcavities containing a gaseous phase.

15. The method of claim 14 further comprising:
providing a superstrate comprising a second semiconductor material, the first and second semiconductor materials being the same or different; and
bonding the superstrate to the structurally-transformed intermediate layer.

16. The method of claim 15 wherein the first and second semiconductor materials comprise one or more of Si, Ge, a III-V compound, GaN, or SiC.

17. The method of claim 15 further comprising:
providing a thermal oxide film on the surface of the substrate layer prior to depositing the intermediate layer; and
providing a thermal oxide film on the surface of the superstrate prior to bonding to the intermediate layer.

18. The method of claim 15, wherein the intermediate layer comprises a phosphosilicate glass material having a thickness between one and ten microns.

19. The method of claim 18, wherein the superstrate has a thickness less than one micron.

20. The method of claim 15, wherein the intermediate layer comprises a borophosphosilicate glass material having a thickness between one and ten microns.

* * * * *